United States Patent [19]

Levinson

[11] Patent Number: 4,534,062
[45] Date of Patent: Aug. 6, 1985

[54] ADJUSTABLE DOUBLE BALANCED MIXER

[75] Inventor: Samuel Levinson, Norwalk, Conn.

[73] Assignee: United Technologies Corporation, Hartford, Conn.

[21] Appl. No.: 575,380

[22] Filed: Jan. 30, 1984

[51] Int. Cl.³ .......................... H03C 1/58; H04B 1/26
[52] U.S. Cl. .................................. 455/330; 332/43 B
[58] Field of Search ............. 455/330, 326, 327, 331; 333/26; 332/43 R, 44, 43 B, 47

[56] References Cited

U.S. PATENT DOCUMENTS

| | | | |
|---|---|---|---|
| 2,923,894 | 2/1959 | Thompson | 332/47 |
| 3,275,951 | 9/1966 | Maass | 332/44 |
| 3,413,571 | 11/1965 | Ulrick et al. | 332/47 |
| 4,355,421 | 10/1982 | Seely | 455/330 |

Primary Examiner—Marc E. Bookbinder
Assistant Examiner—Andrew J. Telesz, Jr.
Attorney, Agent, or Firm—Robert P. Sabath

[57] ABSTRACT

A DC current injectable double balanced diode ring mixer circuit for radio frequency (RF) application. The diode ring includes eight diode elements and defines eight terminals including four symmetrical DC injection ports in conjugate pairs interleaved with four symmetrical RF inputs for phase and anti-phase application.

8 Claims, 1 Drawing Figure

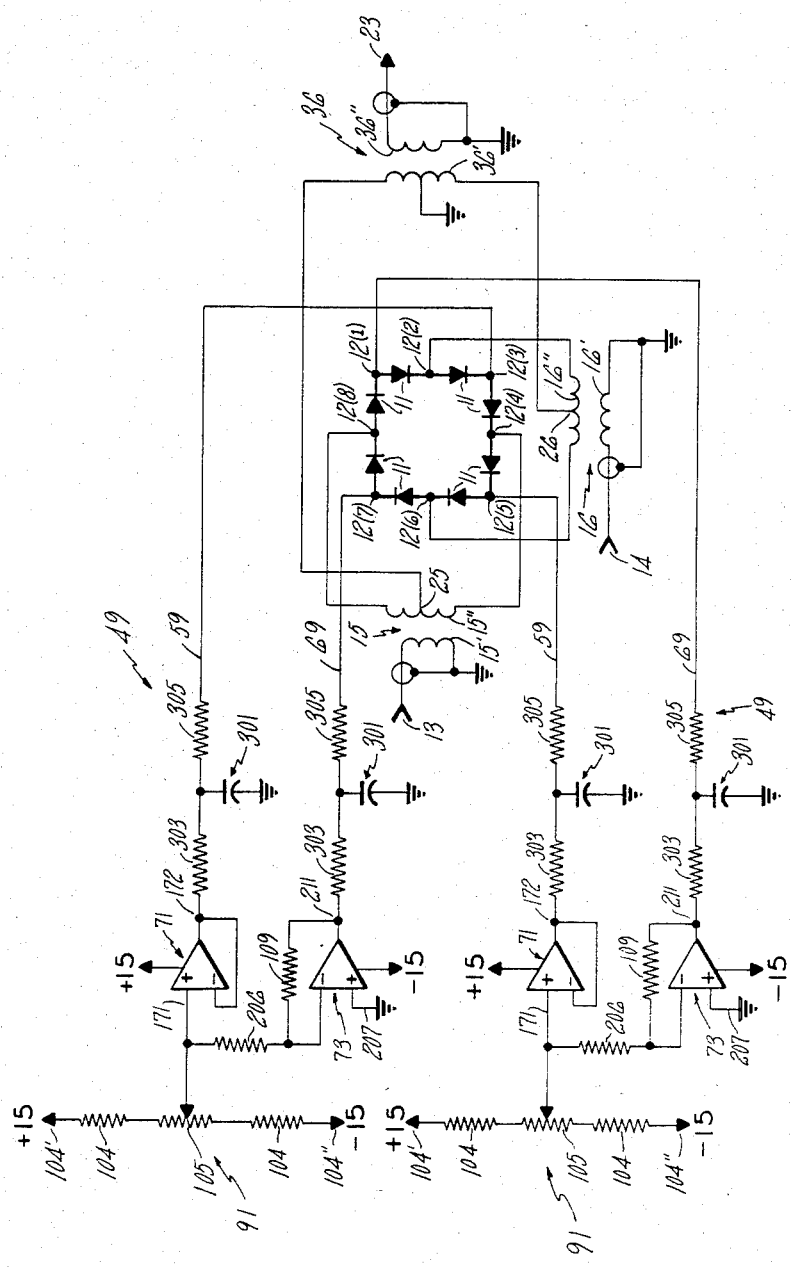

4,534,062

ADJUSTABLE DOUBLE BALANCED MIXER

DESCRIPTION

TECHNICAL FIELD

This invention relates to an adjustable double balanced mixer circuit, and more particularly to a DC-adjustable ring diode double balanced mixer effectively operable with radio and radar systems and devices including for example frequency synthesizers employing high purity RF signal frequencies.

BACKGROUND ART

Double balanced mixers in the radio frequency arts generally, and double balanced mixers in ring diode configurations including four or eight diodes are well known. See for example the publication *RF Signal Processing Components* by Watkins-Johnson of Palo Alto, Calf. Such mixers can be employed for mixing signals, conducting bi-phase modulation and performing phase detection operations.

A problem that arises in the construction of such circuits is that the diodes employed display considerable variation in characteristics. In other words, the diodes in the ring are not all alike electrically, which considerably degrades the performance of the entire ring. The degradation frequently involves the production of spurious modulation products that compromise the intended function of the mixer circuit. These products must then be removed by additional circuit elements such as filters.

Accordingly, it is an object of this invention to compensate for the effect of dissimilar diodes in the ring of a double balanced mixer circuit.

Additionally, it is an object of the invention to compensate for the adverse effects of dissimilar didoes in the ring of the double balanced mixer by injecting DC currents symmetrically into the diode ring.

Furthermore, it is an object of the invention to develop an eight-diode ring double balanced mixer circuit including four symmetrical RF ports interspersed or interleaved with DC bias injection ports for diode dissimilarity compensation.

It is an additional object of the invention to establish a DC bias injection eight diode ring double balanced mixer circuit for RF application.

It is a further object of the invention to develop an eight diode element ring double balanced mixer circuit including eight terminals for connecting the diode elements in ring configuration and additionally thereby establishing two pairs of RF ports and two pairs of DC injection ports.

It is additionally an object of the invention to establish an eight diode ring double balanced mixer with symmetrically disposed, interleaved, interspersed, and cooperative pairs of RF and DC injection ports.

It is a further object of the invention to provide a ring diode double balanced mixer with pairs of DC bias injection conjugate ports effective for providing cooperative positive and negative DC injection of electric current.

It is furthermore an object of the invention to reduce or suppress spurious and/or odd order modulation products from a ring diode double balanced mixer comprising inadvertently dissimilar diode elements by injecting DC currents at symmetrical injection terminals distributed about the diode ring.

DISCLOSURE OF INVENTION

The invention herein is directed toward an eight diode element ring double balanced mixer which has eight or more terminals connecting generally similar diode elements dispersed about the ring.

Four symmetrically disposed terminals are employed as RF inputs. Interleaved therebetween are four symmetrically disposed DC injection terminals. Similar diode elements are unidirectionally connected between the respective terminals.

Each of the two input RF signals to be mixed is applied through a broadband RF input transformer. The respective RF signals thereby effectively transmitted are then applied to opposite RF terminals in the eight diode element ring.

In the case of each RF frequency signal input, one of the ring RF terminals is provided with a given polarity of the RF signal from one end of the secondary coil of the particular transformer, and the RF terminal the opposite side of the ring is provided with the opposite polarity thereof.

Each of the RF terminals along the ring is separated from the next by the intervention of two or more diodes separating in unit elements. Each diode element comprises a predetermined similar number and kind of diode. Adjacent diode elements are connected by a DC or RF input terminal.

Accordingly, the ring is provided with four symmetrically disposed DC injection ports or terminals interspersed or interleaved with the RF terminals.

Each DC injection channel includes a source of DC voltage from a voltage divider circuit, which provides a desired level of input DC current to a pair of operational amplifiers arranged in parallel.

One of the operational amplifiers is employed as a source or voltage follower. The other is configured as an inverting amplifier. Each of the operational amplifiers presents a low output impedance on the other of a fraction of an ohm.

The inverting amplifier of each channel provides a negative complement or conjugate DC level of current for injection, which is equal and opposite to the DC injection current provided by the voltage follower operational amplifier. Accordingly, for each DC current injected at a given DC injection terminal, there is an equal and opposite DC current injected at the opposite terminal of the ring.

Each subchannel of the DC injection network is provided with filter circuitry for isolation while coupling the DC injection current to the ring. This prevents RF signals from feeding back to the respective voltage divider circuit.

BRIEF DESCRIPTION OF DRAWING

The invention set forth herein will be more readily understood by reference to the attached drawing wherein:

The FIGURE shows the circuit of a double balanced ring diode mixer subject to the injection of DC adjustment currents at four symmetrically disposed ports interleaved between diode elements separating the ports from RF input terminals.

BEST MODE FOR CARRYING OUT THE INVENTION

The FIGURE shows a ring of eight diodes 11 disposed in the same direction along the arrangement of a ring and interconnected at respective terminals 12(1) through 12(8). The ring is subject to injected first and second RF frequency inputs, respectively 13 and 14, which are coupled to the ring for mixing operation through respective preferably broadband input transformers 15 and 16. Each transformer includes respective primary and secondary coils, respectively 15' and 15", or 16' and 16" as the case may be. The respective input frequencies are coupled to four terminals spaced symmetrically about the circumference of the ring. Mixing operation combines the input frequencies to produce a third or output frequency 23 at an output transformer 36 including its own primary 36' and secondary 36" coil.

The output frequency 23 is taken from center taps 25 or 26 in the respective secondary coils of transformers 15 and 16. The respective center taps 25, 26 are connected to opposite ends of the primary coil 36' of output frequency transformer 36.

Input connections to both input transformers 15 and 16 and the output connection to transformer 36 are effected through shielded coaxial cables. The outer conductor thereof is grounded.

The FIGURE shows two channels 49 for the injection of DC currents at DC injection terminals 12(1), 12(3), 12(5) and 12(7) in the ring. Each channel 49 is effective for the injection of one of two current quantities at terminals 12(1) and 12(5), or 12(3) and 12(7), which terminal pairs are each directly opposite one another on the ring.

Each channel 49 is divided into two subchannels 59 and 69 respectively, the first of which includes a voltage follower operational amplifier 71, which supplies a primary DC injection current for example to terminal 12(5) or 12(3) of the ring depending upon the channel 49 with which the operational amplifier 71 is associated; and the second of which includes an inverting operational amplifier 73, which is effective for providing the same signal in opposite polarity to respective terminals 12(1) or 12(7) on the diode ring. This opposite polarity signal constitutes the secondary or "conjugate" input DC injection current.

Other injection combinations are possible as well. For example, the primary injection could occur at terminals 12(1) and 12(3) with secondary injection at terminals 12(5) and 12(7). This would certainly be within the concept of symmetrical injection.

The DC corresponding primary and conjugate injection signals or currents from each channel 49 are applied to the ring at terminals symmetrically spaced with respect to each other. This insures effective compensation for dissimilarity between any of diodes 11.

The DC voltage effective for developing DC injection currents for respective channels 49 is variably determinable by adjusting input voltage divider networks 91 including outer preferably 10K resistors 104 bounding a center variable preferably 1K ohm resistor 105. The respective outer resistors 104 are connected at their respective outer terminals 104' and 104" to DC voltage sources of respectively fifteen (15) and negative fifteen (−15) volts.

Each voltage follower operational amplifier 71 has its positive input 171 connected to the variable DC output of the voltage divider network 91. The amplifier 71 is additionally connected to the positive fifteen volt source for biasing. Its negative input terminal is connected to its output 172.

The inverting operational amplifiers 73 in each case are provided with an output voltage from the variable resistor 105 through a large impedance resistor 206, for example 100K ohm. The positive terminal 207 of the inverting amplifier 73 is grounded. The negative terminal is shunted by a large resistor 109 for example valued at 100K ohm, which is connected to the amplifier output 211.

For isolation, each subchannel 59 or 69 as the case may be is provided with a capacitor to ground 301, which is bounded by respective resistors 303 and 305 each for example at about 1K ohm. This insures no RF feedback to the DC injection source voltages.

In operation, frequency output 36 is connected to a suitable spectrum analyzer (not shown) to observe the output modulation. The variable resistor 105 in each case is manually adjusted beginning with zero bias injection until the undesired modulation products due to dissimilar diode elements are effectively eliminated.

After reading the foregoing, it is likely that other ways to carry out the invention will occur to those skilled in the art. Some of these ways may fall within the scope of the instant invention, which is expressly set forth and defined in the claims which follow.

I claim:

1. An adjustable double balanced mixer circuit including input and output frequency terminals for mixing a pair of frequencies to generate an output frequency signal, said mixer circuit comprising:

ring diode means for developing a mixed signal freuqency, including an even number of diode means for directing the flow of electric current, each of said diode means including an input and output terminal and connected at its output terminal to the input terminal of one other of said diode means;

first and second DC injection means for applying selected DC current levels of opposite polarity to symmetrical opposite ones of said input terminals, the injection of DC currents being conducted at input terminals which are symmetrically disposed about said ring diode means, to compensate for dissimilarities among said diode means, each of said DC injection means including first and second amplifier means for developing respective first and second DC injection currents;

first and second RF injection means for respectively applying first and second signal frequencies to input terminals of said ring diode means, symmetrically interleaved with the input terminals subject to DC current injection.

2. The method of mixing frequencies in an adjustable double balanced mixer circuit including input and output frequency ports for mixing a pair of frequencies to generate an output frequency signal, said method comprising the steps of:

(a) arranging an even plurality of diode means end-to-end for directing the flow of electric current in a ring diode means for developing a mixed signal frequency, thereby establishing a corresponding plurality of input terminals to said plurality of diode means;

(b) providing first and second DC injection means for each applying selected DC current levels of opposite polarity to symmetrical opposite ones of said input terminals, the injection of DC currents being conducted at input terminals which are symmetrically disposed about said ring diode means, to compensate for dissimilarities among said diode means;

(c) symmetrically interleaving between said first and second DC injection means, first and second RF injection means for respectively applying first and second frequencies from said input frequency ports to said ring diode means.

3. The invention of claims 1 or 2, wherein each said DC injection means includes first and second amplifier means for developing respective first and second DC injection currents which are opposite in polarity.

4. The invention of claim 3, wherein said respective DC injection currents are equal in magnitude.

5. The invention of claims 1 or 2, wherein each said RF injection means includes a broadband RF transformer for receiving a particular input signal frequency for mixing.

6. The invention of claim 5, wherein each said RF transformer includes an input and an output coil.

7. The invention of claims 1 or 2, further comprising in each DC injection means, filter means for isolating the source of DC power from RF signal frequencies.

8. The invention of claims 1 or 2, wherein the number of diode means is eight.

* * * * *